(12) United States Patent
Diaz et al.

(10) Patent No.: US 6,623,605 B2
(45) Date of Patent: Sep. 23, 2003

(54) METHOD AND APPARATUS FOR FABRICATING A WAFER SPACING MASK ON A SUBSTRATE SUPPORT CHUCK

(75) Inventors: Ruben Diaz, Sterling, VA (US); Shaofeng Chen, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 83 days.

(21) Appl. No.: 10/006,423

(22) Filed: Dec. 6, 2001

(65) Prior Publication Data

US 2003/0106196 A1 Jun. 12, 2003

(51) Int. Cl.$^7$ .......................... C23C 14/34; C23C 16/00
(52) U.S. Cl. .......................... 204/192.13; 204/192.12; 204/298.11; 427/9; 427/282; 118/720; 118/721
(58) Field of Search ................ 204/192.12, 192.13, 204/298.11; 427/9, 282; 118/720, 721

(56) References Cited

U.S. PATENT DOCUMENTS

| | | | |
|---|---|---|---|
| 5,656,093 A | 8/1997 | Burkhart et al. | ............ 118/728 |
| 5,863,396 A | 1/1999 | Flanigan | ................ 204/298.11 |

*Primary Examiner*—Rodney G. McDonald
(74) *Attorney, Agent, or Firm*—Moser, Patterson & Sheridan LLP

(57) ABSTRACT

A method and apparatus for fabricating a wafer spacing mask and a substrate support chuck. Such apparatus is a stencil containing a plurality of dual counterbored apertures that is positioned atop the substrate support chuck while material is deposited onto the stencil and through the apertures' openings onto the chuck. Upon completion of the deposition process, the stencil is removed from the workpiece support chuck leaving deposits of the material of various widths but the same heights to form the wafer spacing mask.

21 Claims, 6 Drawing Sheets

US 6,623,605 B2

METHOD AND APPARATUS FOR FABRICATING A WAFER SPACING MASK ON A SUBSTRATE SUPPORT CHUCK

BACKGROUND OF THE INVENTION

1. Field of the Invention

The invention relates to a sputter mask or stencil used to control deposition of material in a physical vapor deposition (PVD) system. More particularly, the invention relates to a method and apparatus for precise formation of features on the surface of a substrate support chuck used in a process chamber.

2. Background of the Related Art

Substrate support chucks are widely used to support substrates within semiconductor processing systems. A particular type of chuck is a ceramic electrostatic chuck that is used in high-temperature semiconductor processing systems such as high-temperature physical vapor deposition (PVD). These chucks are used to retain semiconductor wafers or other work pieces in a stationary position during processing. Such electrostatic chucks contain one or more electrodes embedded within a ceramic chuck body. The ceramic material is typically aluminum-nitride or alumina doped with a metal oxide such as titanium oxide ($TiO_2$) or some other ceramic material with similar resistive properties.

One disadvantage of using a chuck body fabricated from ceramic is that, during manufacture, the support surface is "lapped" to smooth the ceramic material. Such lapping produces particles that adhere to the support surface. These particles are very difficult to completely remove from the support surface. The lapping process may also fracture the chuck body. Consequently, as the chuck is used, particles are continuously produced by these fractures. Additionally, during wafer processing, the ceramic material can abrade a wafer oxide coating from the underside of the wafer resulting in further introduction of particulate contaminants to the process environment. During use of the chuck, the particles can adhere themselves to the underside of the wafer and be carried to other process chambers or cause defects in circuitry fabrication upon the wafer. It has been found that tens of thousands of contaminant particles can adhere to the backside of a given wafer after retention upon a ceramic electrostatic chuck.

To overcome the disadvantages associated with the workpiece substrate contacting the substrate support chuck, a wafer spacing mask is placed upon the surface of the substrate support chuck. Such a wafer spacing mask is disclosed in commonly assigned U.S. Pat. No. 5,656,093, which is hereby incorporated by reference. The material deposited upon the support surface of the chuck body (i.e., the wafer spacing mask) is a, metal such as titanium, titanium nitride, stainless steel and the like. The material supports a semiconductor wafer in such a way that the surface of the wafer that faces the chuck is spaced apart and substantially parallel to the surface of the chuck. Usually the material is deposited to form a plurality of pads, although any wafer spacing pattern deposited on the surface of the substrate support chuck may be used. Thus, the wafer spacing mask reduces the amount of contaminant particles that adhere to the underside of the wafer.

FIG. 1 depicts a perspective view of a prior art stencil for depositing support surface features. Such stencil is more fully seen and described in U.S. Pat. No. 5,863,396. The above-referenced device is a plate-shaped stencil 100 having a plurality of apertures 108 and a plurality of slots 106 although various other configurations are possible. Material is deposited through the apertures 108 and slots 106 (e.g., via physical vapor deposition) to create the desired surface features on the support surface. The height of such features (i.e., the pads formed by apertures 108) must be within 10% of each other to avoid undue flexing and provide uniform support for the wafer to be processed.

FIG. 2 depicts a cross-section as seen along lines 2—2 of FIG. 1 of the prior art stencil as placed on top of a surface 210 of a ceramic electrostatic chuck 200 following deposition of the surface features by physical vapor deposition (PVD). As can be seen, some deposited material 206 forms on the stencil. Some deposited material forms support surface features 204 that have larger dimensions than other features 202. Some features are taller in profile as a result of the "shadowing" effect. The "shadowing" effect is a condition by which PVD material approaching the stencil at angles that are not nearly perpendicular to the stencil is deposited on the sidewalls of the aperture instead of the support surface. Accordingly, this will cause some features to protrude above a desired height "d" from the surface 210. By mapping the inconsistencies in pad height, it has been ascertained that pads over the outer areas of the substrate support are higher than those radially inward. Unfortunately, this condition is undesirable as it leads to non-uniform substrate support, i.e.; the point of contact of the various features with the wafer will be at different heights. A non-uniform substrate support condition alters the critical temperature profile on the wafer and results in excessive bowing of the wafer during chucking. These undesirable conditions eventually alter the quality of the final product.

Therefore, a need exists in the art for a method and apparatus for fabricating a wafer spacing mask having a plurality of features wherein the plurality of features are formed simultaneously, uniform in profile and wherein the wafer spacing mask can easily be removed from the chuck assembly.

SUMMARY OF THE INVENTION

The disadvantages heretofore associated with the prior art are overcome by a method and apparatus for forming features on a substrate support chuck. The apparatus is a stencil containing a plurality of apertures, each of said apertures having a dual counterbore. The stencil comprises a plate-shaped one-piece structure having a central opening with a plurality of apertures radiating from the central opening outward about the plate-shaped structure. The stencil is preferably fabricated from a ceramic material such as alumina.

A method of forming features on a surface of a substrate support chuck with the stencil comprises the steps of positioning the stencil on the surface of the substrate support chuck; depositing the material onto the stencil and through a plurality of dual counterbored apertures provided in the stencil to form said features upon the surface of the substrate support chuck; removing said stencil and leaving said features upon said surface of said substrate support chuck. The method uses a stencil having a central opening and a plurality of dual counterbored apertures disposed about the plate.

BRIEF DESCRIPTION OF THE DRAWINGS

The teachings of the present invention can be readily understood by considering the following detailed description in conjunction with accompanying drawings, in which.

DETAILED DESCRIPTION OF THE PREFERRED EMBODIMENT

Figure 1:
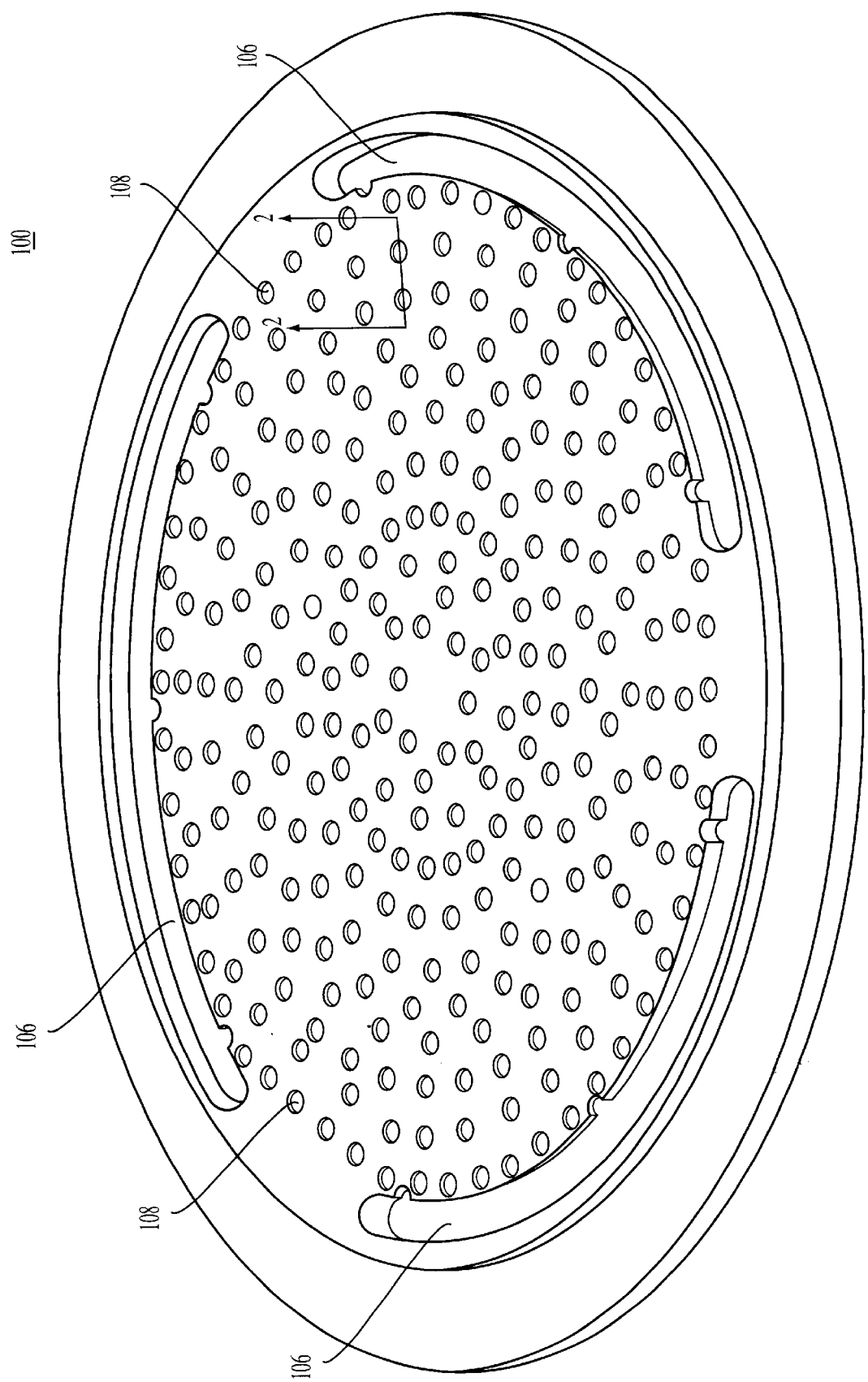
FIG. 1 depicts a perspective view of a prior art stencil for depositing support surface features.
Figure 2:
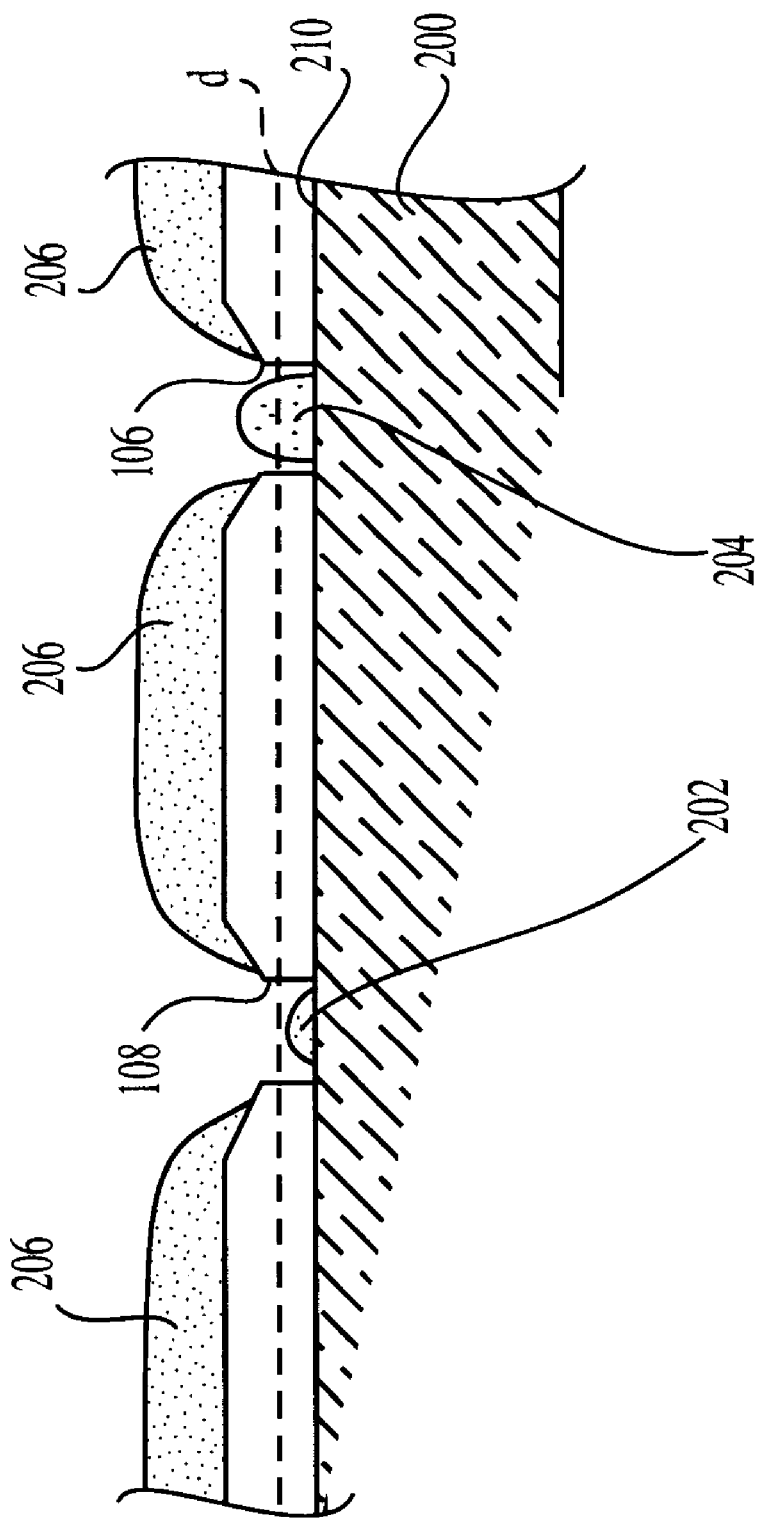
FIG. 2 depicts a cross-sectional view as seen along lines 2—2 of FIG. 1 of the prior art stencil.
Figure 3:
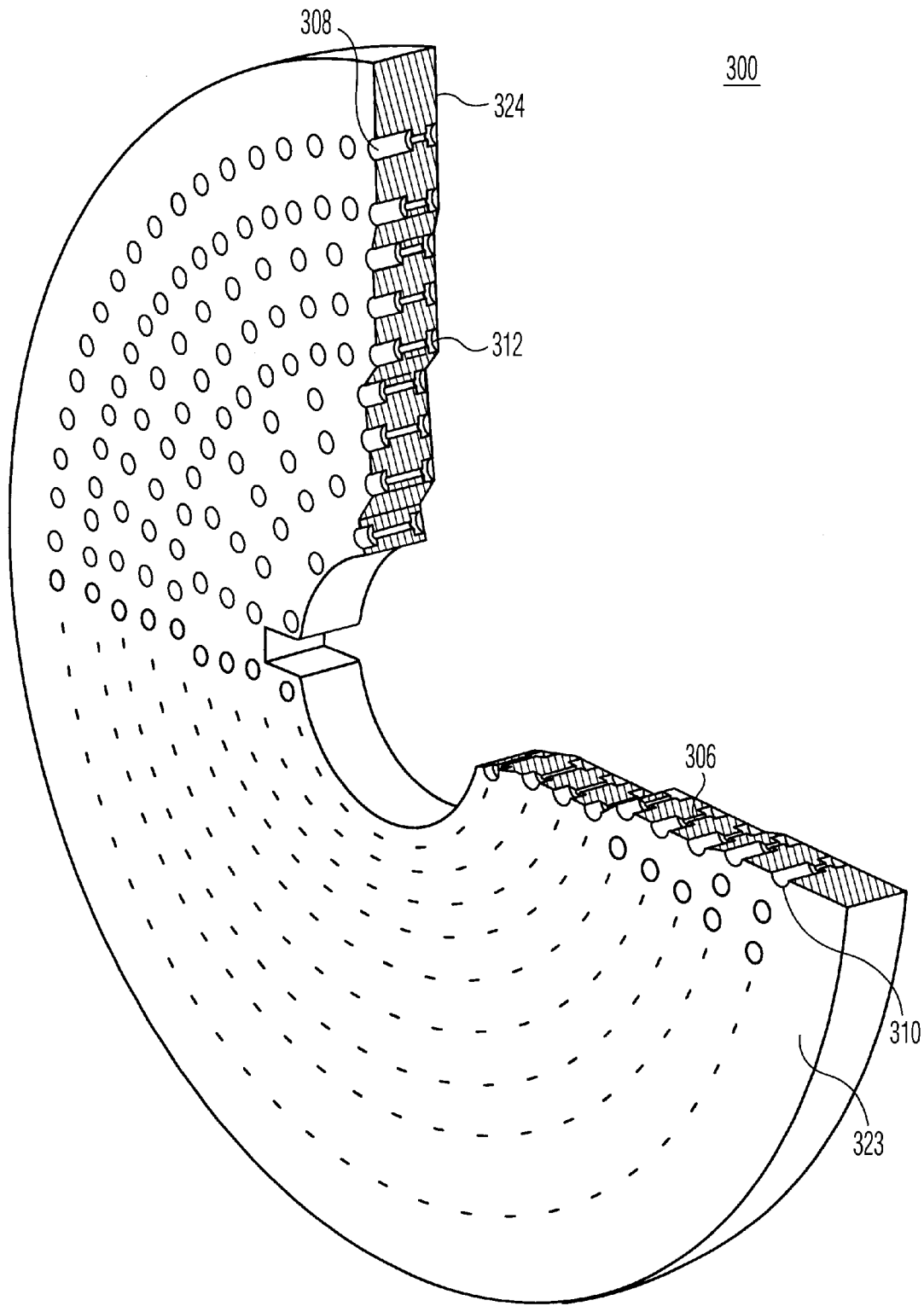
FIG. 3 depicts a perspective view of a sputter mask in accordance with the present invention.

One solution to forming features having uniform profiles (heights) is shown in FIG. 3. FIG. 3 shows a sputter mask 300 having a plurality of dual counterbored apertures 308. For best understanding of the invention, the reader should simultaneously refer to both FIGS. 3 and 4 while reading the following. The sputter mask 300 comprises a plurality of dual counterbored apertures 308. The plurality of dual counterbored apertures 308 are each comprised of a center bore 306, a forming aperture 310 on the top of the sputter mask 300 and a release counterbore aperture 312 formed on the bottom 324 of the sputter mask 300. All of the release apertures 312 along the bottom of the sputter mask 300 are formed having the same dimensions. The release apertures 312 all have the same diameter and the same depth. The forming apertures 310 disposed on the top 323 of the sputter mask 300 penetrate to different depths. Each aperture 308 is created by forming a central bore 306 and disposing a counterbored aperture 310, also known as the top counterbored hole on the top 323 of the sputter mask 300. The depth of the top counterbored hole 310 varies as a function of distance beginning at the geometric center 301 of the sputter mask 300 and radiating outward. Illustratively, each of the dual counterbored apertures 308 has on its upper surface 323 a top counterbored hole known as the forming aperture 310 having a diameter of approximately 0.165 inches. Opposite each top counterbored holes 310 on the bottom surface 324 is a bottom counterbored hole known as the release aperture 312 having a diameter of approximately 0.090 inches and a depth of 0.008 inches. Many other sizes and arrangements of apertures are available and all such variations are considered within the scope of the present invention.

Figure 4:
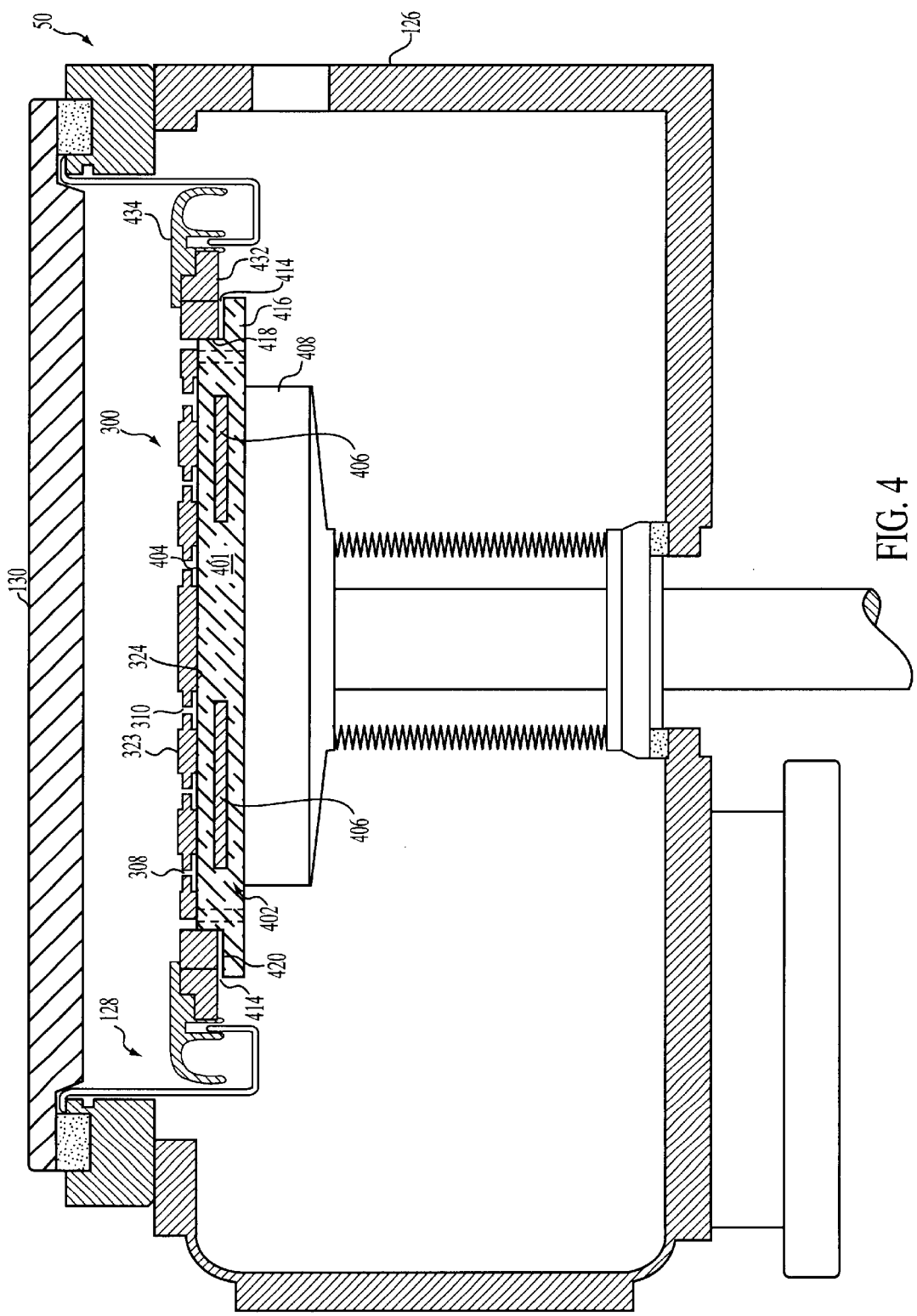
FIG. 4 depicts a cross-sectional view of the sputter mask positioned on the surface of a substrate support chuck within a physical vapor deposition system.

As shown in FIG. 4, the specific shape of the sputter mask 300 depends on the shape of the substrate support chuck 402. Typically, a substrate support chuck 402 is circular, i.e., disk or plate shaped, in plan form, matching the shape of a typical semiconductor wafer as commonly known in the art. The substrate support chuck 402 is generally supported upon a support apparatus 408. The support apparatus 408 supports the chuck 402 and allows for heating, cooling and retaining a workpiece or substrate upon the surface 404 of the substrate support chuck 402. To retain a workpiece on the chuck surface 404, the chuck 402 contains one or more elements 406 for electrostatically clamping the workpiece upon connection to an appropriate power source (not shown). The chuck 402 may also employ a mechanical system for preventing movement or the workpiece (i.e., circumferencially disposed clamp ring or integrated vacuum parts (not shown)). The present invention is applicable to any of the commonly used chuck types. Therefore, the specific nature of the chuck 402 and its operation is irrelevant to the present invention.

The sputter mask 300 is shaped such that when it is placed on the surface of the substrate support chuck 402, the bottom surface 324 of the sputter mask 300 is supported by the surface 404 of a chuck 402. In the depicted embodiment, the substrate support chuck 402 contains a flange 416 that extends radially from the central body 401 of the chuck 402 and circumscribes the entire chuck body 401. As such, the circumferential edge 418 of the chuck body 401 is used to center the sputter mask 300 upon the chuck 402. Although the sputter mask 300 rests upon the chuck surface 404, there are areas of the sputter mask 300 that do not contact the surface 404 of the substrate support chuck 402. In particular, the sputter mask 300 does not contact a surface 420 of the flange 416. A gap 414 is formed between the flange of the substrate support and the sputter mask 300. The sputter mask 300 extends beyond the edge of the flange 416 of the support surface to form an overhang 432. In use, this overhang 432 supports a conventional cover ring 434.

Figure 5A:
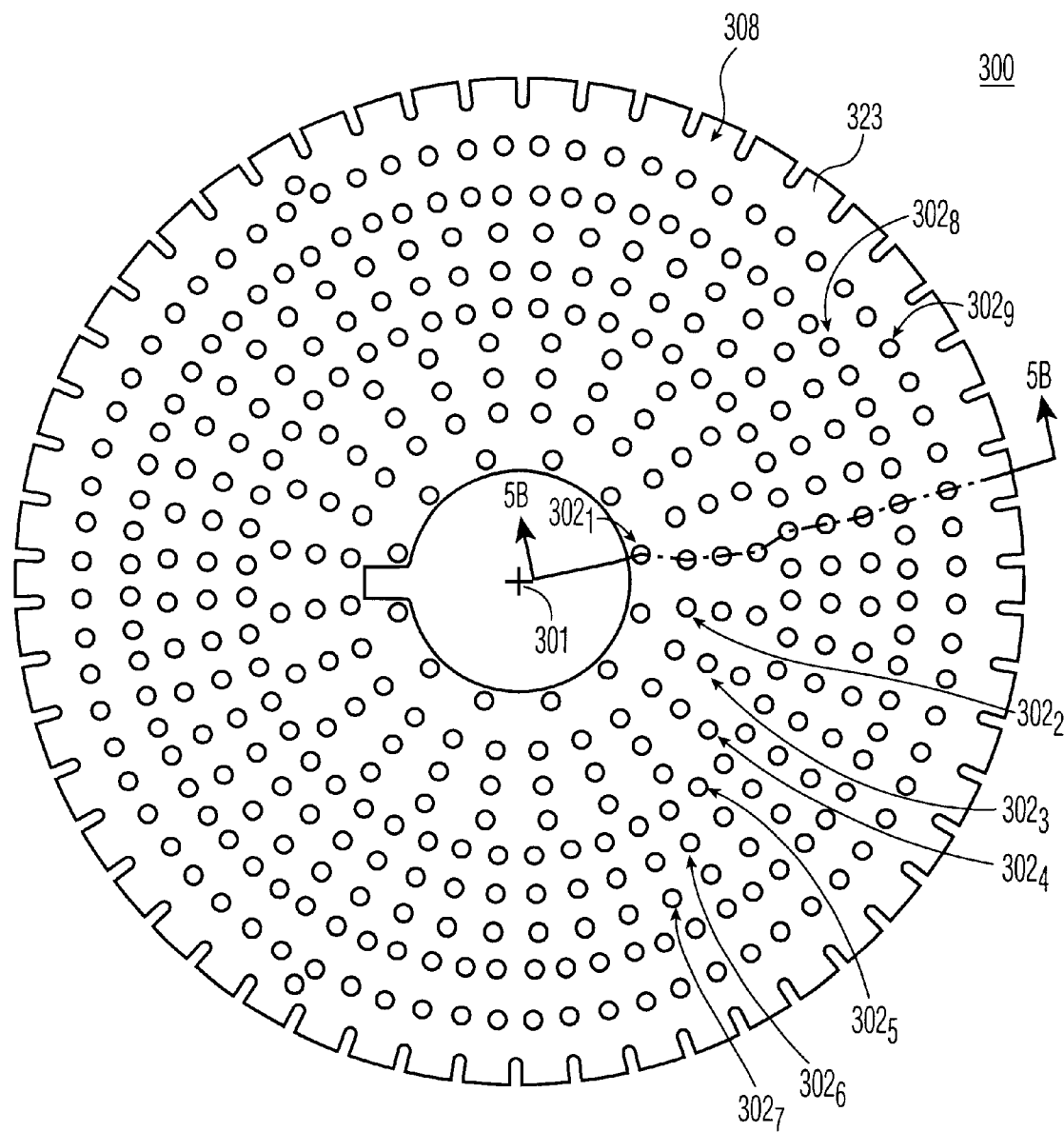
FIG. 5A depicts a plan view of a sputter mask in accordance with the present invention.
Figure 5B:
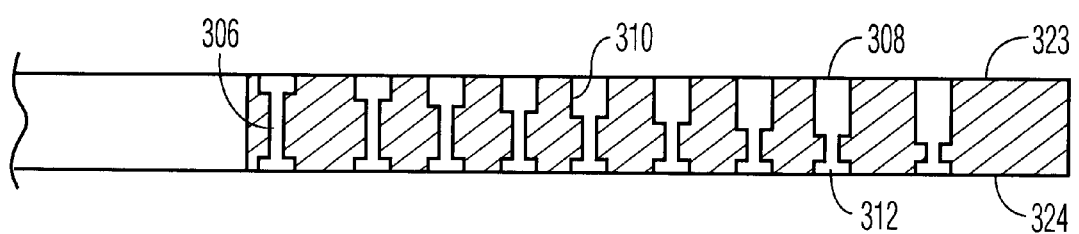
FIG. 5B depicts a cross-sectional view along lines 5B—5B of FIG. 5A of the sputter mask according to the present invention.

The sputter mask 300 contains approximately 372 dual counterbored apertures 308 that are arrayed in a pattern of concentric rings. FIGS. 5A and 5B each depict a different view of a sputter mask according to the present invention and it may be helpful to the reader to view both figures simultaneously. FIG. 5A depicts a plan view of a sputter mask in accordance with the present invention. FIG. 5B depicts a vertical cross-sectional view along line 5B—5B of FIG. 5A. The present embodiment shows the dual counterbored apertures 308 arranged in a plurality of concentric circular patterns 302 radiating from the center 301. The dual counterbored apertures 308 have forming apertures 310 that vary in depth from approximately 0.062" in a first circular pattern $302_1$, to approximately 0.065" in a ninth circular pattern $302_9$. The concentric circular patterns are equidistantly spaced from each other and begin in an area located a distance from the central point 301. The present embodiment features nine concentric circular patterns. The first concentric circular pattern $302_1$ has twelve equally spaced dual counterbored apertures 308 arranged within it. The forming apertures 310 of the first concentric circular pattern $302_1$ are bored to a depth of approximately 0.062 inches (see FIG. 5B for detail). Second, third and fourth concentric circular patterns $302_2$, $302_3$ and $302_4$ respectively, each have twenty-four equally spaced dual counterbored apertures 308 arranged within them. The forming apertures 310 of the second, third and fourth concentric circular patterns are bored to a depth of approximately 0.063 inches respectively. Fifth, sixth and seventh concentric circular patterns $302_5$, $302_6$ and $302_7$ respectively, each have forty-eight equally spaced dual counterbored apertures 308 arranged within them. In the fifth concentric circular pattern the depth of the forming apertures 310 is approximately 0.063 inches while the depth of the forming apertures 310 for the sixth and seventh concentric circular patterns is approximately 0.064 inches. Lastly, the eighth and ninth concentric circular patterns $302_8$ and $302_9$ respectively each have 72 equally spaced dual counterbored apertures 308 arranged within them. Both the eighth and ninth concentric circular patterns have forming apertures 310 bored to a depth of approximately 0.065 inches.

Typically, the material of the sputter mask 300 is titanium. Other materials can be used such as silicon, ceramic, aluminum, aluminum nitride and the like. The choice of material depends on the type of system the sputter mask 300 will be used in. For example, in PVD systems, materials that minimize differential thermal expansion such as titanium are the most desirable materials for the sputter mask 300. Another consideration in choosing sputter mask material is the material that will be sputtered in the system to form deposits on the surface of the substrate support. For example, it is impossible to clean and reuse a titanium mask that has been sputtered with titanium. Therefore, if a reusable mask is desirable, the mask 300 should be fabricated from a different material than that which is being sputtered, e.g., a silicon mask would be appropriate for sputtering titanium.

Figure 6:
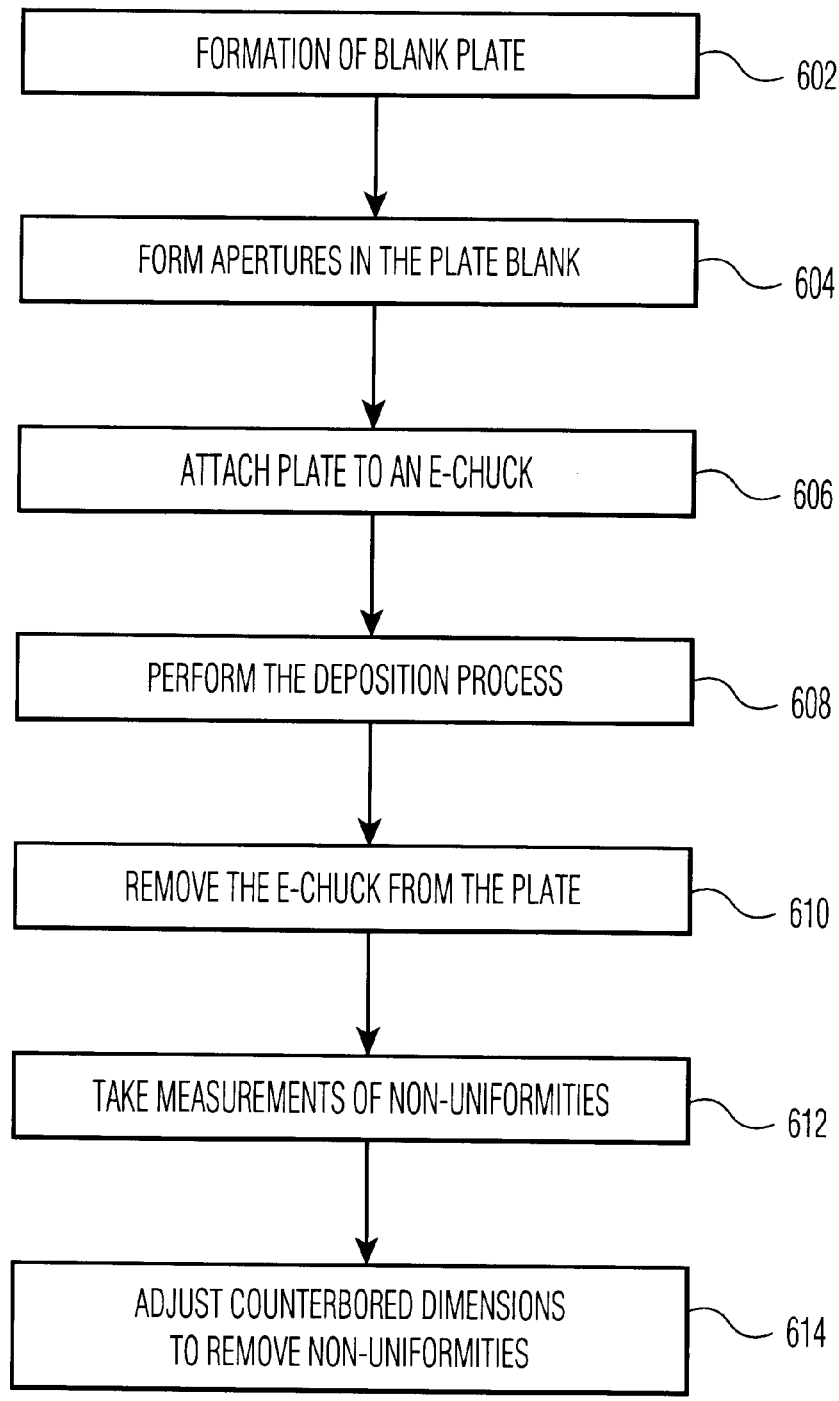
FIG. 6 depicts a flow chart for producing a sputter mask according to the present invention.

A method of making the sputter mask 300 is shown in FIG. 6 as a series of method steps 600. The method begins at step 602 with a blank disk of suitable material such as but not limited to aluminum. In the present embodiment the disk is approximately 0.120 inches thick and approximately eight inches in diameter. It is appreciated by those skilled in the art that these dimensions may vary widely. In step 604, a plurality of dual counterbored apertures is formed having the characteristics as previously described. The sputter mask is then mounted on a test e-chuck at step 606. A layer of material is then deposited onto the sputter mask in step 608. After the deposition process is complete the sputter mask is removed from the test e-chuck at step 610 and measurements are taken at step 612 to determine the non-uniformity distribution parameters. The data taken from the measurements is used to develop and adjust the depth of the forming aperture 310 of the dual counterbored apertures 308 at step 614 as they radiate from the central point. This final adjustment counteracts any of the non-uniformities in the features from the deposition process.

A method of forming deposits on the surface 404 of the substrate support chuck 402 begins with placement of the sputter mask 300 onto the substrate support surface within a PVD system 50 as seen in FIG. 4. In addition to the chuck 402, the PVD system contains a chamber 126 (vacuum chamber) containing a vacuum, a cover ring assembly 128 for confining the deposition proximate the chuck, and a target 130. The PVD system is a conventional system that is operated in a conventional manner to cause sputtering of the target material upon the sputter mask 300 and the exposed support surface 404 of the chuck 402. The deposition material is a material that bonds to and is thermally compatible with the chuck material. For example, for ceramic chucks, deposition materials include boron-nitride, diamond, oxides, such as aluminum oxide, and metals such as titanium. In general, this technique for patterned deposition of materials is known as lift-off deposition.

To fabricate a sufficient plurality of features, the PVD system deposits a 1 micron layer of material on the substrate support chuck 402 while the sputter mask 300 is positioned on the support surface 404 of the chuck 402. Deposition material passes through the apertures 308 of the sputter mask 300 onto the surface of the substrate support 404. Additionally, a second layer of material may be deposited over the first layer for example, an insulator may be first deposited and a conductor deposited thereover. Any number of layers comprising various materials can be deposited using this process. Following the deposition, the target 130 is removed from the chamber 126 such that the sputter mask 300 can be removed from the chuck surface 404 through the top of the PVD system enclosure. The bottom counterbores 312 prevent sticking of the sputter mask 300 to the deposited material of the chuck 402 and provide material deposits having convex (domed) surfaces. The result is a pattern of deposition material atop the chuck surface 404 and the flange surface 420. The combination of the dual counterbored holes 310 and 312 ensures a uniform (±10% of height of all fixtures) layer of deposited material during the deposition process.

While the foregoing is directed to the preferred embodiment of the present invention, other and further embodiments of the invention may be devised without departing from the basic scope thereof, and the scope thereof is determined by the claims that follow.

What is claimed is:

1. Apparatus for forming features on a substrate support chuck comprising:
    a sputter mask comprising a single plate having a first surface and a second surface and a plurality of apertures each of said apertures having a dual counterbore construction.

2. The apparatus of claim 1, wherein each of the dual counterbore apertures further comprises a first counterbore originating at the first surface and the second counterbore originating at the second surface, both counterbores are disposed a distance into said plate.

3. The apparatus of claim 2, wherein the first counterbore and the second counterbore are connected by a center bored aperture.

4. The apparatus of claim 2, wherein the depth of the first counterbore from the first surface varies dependent upon aperture position on the plate.

5. The apparatus of claim 2, wherein the depth of the second counterbore from the second surface remains the same over the plurality of apertures disposed in the plate.

6. The apparatus of claim 1, wherein the sputter mask is formed of ceramic material.

7. The apparatus of claim 6, wherein said ceramic material is alumina.

8. The apparatus of claim 1, wherein the number of dual counterbore apertures that are disposed in the plate is 372.

9. The apparatus of claim 1, wherein the plate is formed of a material selected from the group consisting of ceramic, silicon, aluminum nitride and boron.

10. The apparatus of claim 1, wherein said plurality of apertures are disposed in an arrangement of concentric rings radiating from the center of the plate.

11. The apparatus of claim 1, wherein the plate is substantially circular in shape.

12. The apparatus of claim 1, wherein the plate further comprises a plurality of slots disposed about the periphery of the plate.

13. The apparatus of claim 1, wherein the preferred depths of the first counterbores are in the range of 0.062" to 0.065".

14. A method for forming a sputter mask comprising:
    forming a blank plate;
    forming a plurality of apertures in the plate to create the sputter mask;
    disposing the sputter mask on a substrate support;
    performing a deposition process to form features of the sputter mask on the substrate support;
    removing the sputter mask from the substrate support;
    taking measurements of the features on the substrate support; and
    adjusting depth of the apertures in the sputter mask.

15. The method of claim 14, wherein the step of forming apertures further comprises forming a series of central apertures followed by forming at least a first and second opposing counterbore apertures about the central aperture.

16. The method of claim 14, wherein the step of disposing the sputter mask to the substrate support further comprises clamping the sputter mask to the substrate support.

17. The method of claim 15, wherein the step of adjusting the apertures further comprises deepening the bores of the first counterbore apertures.

18. The method of claim 17, wherein the step of deepening the bores of the first counterbore apertures further comprises sinking the bores to a depth in the range of 0.062" to 0.065".

19. Apparatus for forming features on a substrate support chuck comprising:

a sputter mask comprising a single ceramic plate having a first surface and a second surface and a plurality of apertures disposed therebetween, each of said apertures having a dual counterbore construction whereby a plurality of first counterbores on the first surface vary in the depth as a function of their radial location on the mask.

20. The apparatus of claim 19, wherein the plurality of apertures is 372 in number and formed in concentric rings radiating from the center of the plate.

21. The apparatus of claim 19, wherein the depth of a plurality of second counterbores on the second surface is fixed.

* * * * *